United States Patent
Dinger et al.

(10) Patent No.: US 6,700,952 B2
(45) Date of Patent: Mar. 2, 2004

(54) OPTICAL APPARATUS FOR DIFFRACTING RADIATION HAVING WAVELENGTH ≦160 NM

(75) Inventors: Udo Dinger, Oberkochen (DE); Martin Ross-Messemer, Essingen (DE)

(73) Assignee: Carl Zeiss SMT AG (DE)

( * ) Notice: Subject to any disclaimer, the term of this patent is extended or adjusted under 35 U.S.C. 154(b) by 262 days.

(21) Appl. No.: 09/760,091

(22) Filed: Jan. 11, 2001

(65) Prior Publication Data
US 2002/0009178 A1 Jan. 24, 2002

(30) Foreign Application Priority Data
Jan. 14, 2000 (DE) .......................... 100 01 291

(51) Int. Cl.[7] ................................ G21K 1/06
(52) U.S. Cl. ...................... 378/84; 378/34; 378/145
(58) Field of Search .................... 378/34, 84, 145

(56) References Cited

U.S. PATENT DOCUMENTS

| | | | |
|---|---|---|---|
| 4,346,965 A | 8/1982 | Sprague et al. | 350/358 |
| 5,123,036 A * | 6/1992 | Uno et al. | 378/34 |
| 5,444,753 A * | 8/1995 | Hayashida et al. | 378/35 |
| 5,825,844 A | 10/1998 | Miyake et al. | 378/34 |
| 5,896,438 A * | 4/1999 | Miyake et al. | 378/34 |

OTHER PUBLICATIONS

"Werkstoffe Sollen Fühlen Lernen" VDI Nachrichten, Köln, Apr. 12, 1998.

* cited by examiner

*Primary Examiner*—Harshad Patel
(74) *Attorney, Agent, or Firm*—Ohlandt, Greeley, Ruggiero & Perle, LLP

(57) ABSTRACT

There is provided an optical apparatus for radiation with a wavelength ≦160 nm. The apparatus comprises a mirror with a mirror surface, and a first device for generating elastic oscillations with different acoustic wavelengths on the mirror surface due to surface deformations. Radiation impinging on the mirror surface is diffracted in a predetermined range of angles ($\alpha$).

31 Claims, 4 Drawing Sheets

$t = t_0$

−1 diffraction order   $\theta_r = \theta_i - \theta_b$ 0 diffraction order   $\theta_r = \theta_i$ +1 diffraction order   $\theta_r = \theta_i + \theta_b$ $t = t_1$ −1 order 0 order +1 order

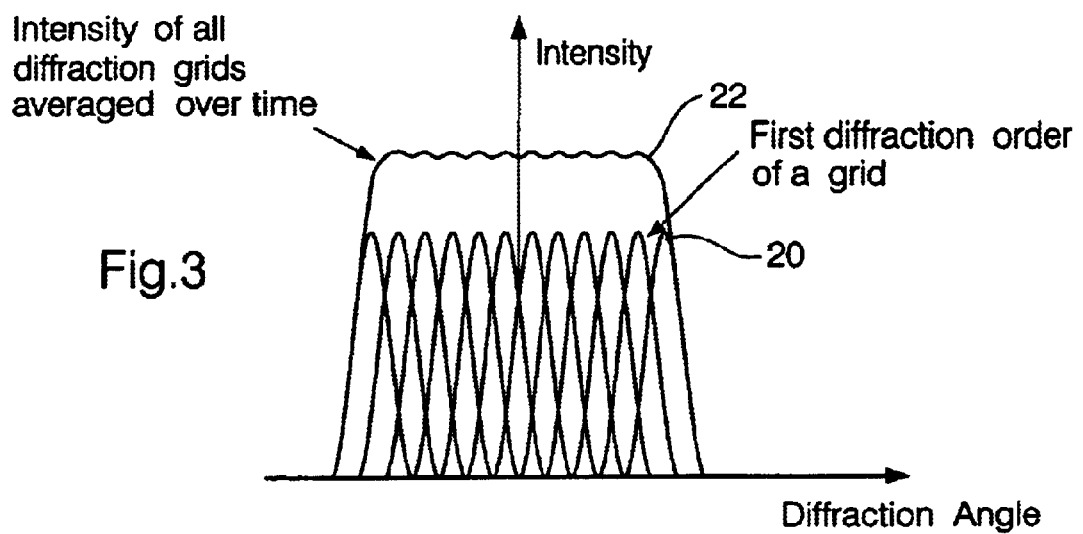
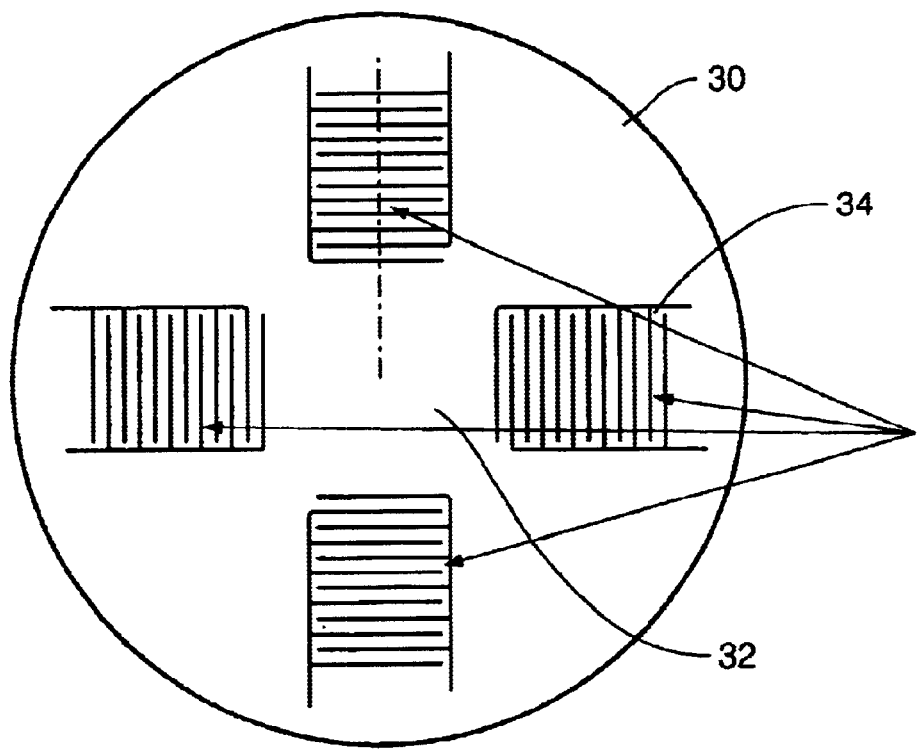

OPTICAL APPARATUS FOR DIFFRACTING RADIATION HAVING WAVELENGTH ≦160 NM

BACKGROUND OF THE INVENTION

1. Field of the Invention

The invention concerns an optical device for radiation with a wavelength ≦160 nm, preferably EUV radiation, with a mirror with a mirror surface, as well as a device for the generation of elastic oscillations of the mirror surface based on surface deformations, as well as the use of such a component, a process for illuminating a predetermined angular range by a light source with such a component, as well as a process for the production of such an optical device.

2. Description of the Related Art

In components for optics, particularly lithography with wavelengths ≦160 nm, for example in the EUV range, the problem arises in that, on the one hand, in order to avoid scattering outside the image field or for producing high reflectivities, extremely small residual roughness of 0.1 to 0.5 nm in the HSFR (high spatial frequency range), which lies in the range >1000 mm$^{-1}$, are required, while, on the other hand, for some applications, a relatively high roughness (1 nm–100 nm) in the MSFR (middle spatial frequency range), which lies between 1000 mm$^{-1}$ and 1 mm$^{-1}$, is required. A component with such a surface specification, for example, is a diffuser for optics with wavelengths ≦160 nm, preferably for use in the EUV range.

Such surface specifications cannot be achieved with a polishing process for static components.

SUMMARY OF THE INVENTION

One object of the invention is therefore to provide an optical device, for optics using wavelengths ≦160 nm, to fulfill these surface specifications.

According to the invention, this object is solved by an active optical device with a mirror comprising a mirror surface, a device for generating elastic oscillations of the mirror surface based on surface deformations, wherein the device is characterized in that radiation impinging on the outer mirror surface, i.e., exterior mirror surface, is diffracted at a predetermined angular range.

An acoustic-optical modulator/deflector has been made known from U.S. Pat. No. 4,346,965, in which a light beam is introduced into a substrate at such an angle that complete internal reflection occurs at an inner substrate surface. The inner substrate surface in turn is configured as the active substrate surface, on whose surface are formed surface waves, so that the radiation impinging on the substrate surface is reflected or is diffracted in the first order. Since light with a wavelength of ≦160 nm practically can no longer be transmitted through a solid, but on the other hand, according to U.S. Pat. No. 4,346,965, light must penetrate the substrate surface, the device known from U.S. Pat. No. 4,346,965 is not suitable for light with a wavelength ≦160 nm.

An active optical component for EUV lithography, i.e., wavelengths starting at 13 nm, has been made known from U.S. Pat. No. 5,825,844. A component according to U.S. Pat. No. 5,825,844 involves an optical device with a mirror with a mirror surface, wherein oscillations of the mirror surface can be induced by surface deformations. Of course, in the device according to U.S. Pat. No. 5,825,844, radiation impinging on the surface will only be reflected, that is, the angle of incidence and the angle of reflection are identical. The maximum angle of deflection is then limited to ±2.5 mrad.

The device of U.S. Pat. No. 5,825,844 is further limited by the fact that possible macroscopic damages of the mirror surface, for example dust particles or scratches, are averaged over time by the active induction of oscillations.

The inventors have recognized that an essentially larger angular range of ±12 mrad, for example, can be passed, if, instead of reflection, diffraction is produced at the exterior side of the mirror surface. It is also possible to obtain a completely homogeneous illumination of the angular range of ±12 mrad averaged over time by diffraction at grids generated by surface waves, if the frequency of the surface waves is continually varied. In contrast to reflection, in diffraction, light is utilized, which falls in the 1 and −1 orders of diffraction of the grid produced by the surface wave and its angle of reflection is thus different from the angle of incidence. In contrast to reflection, in which the incident light thus impinges on the mirror surface so that it illuminates less than a wavelength of the acoustic grid produced by the surface wave, in the case of diffraction, a large number of grid lines, for example, more than 100 grid lines, are impinged.

The wavelength of the acoustical surface wave preferably lies in the range of 1 μm to 50 μm and the amplitude in the range of 1 nm to 100 nm. With such values, one can achieve a ratio of amplitude to wavelength of 1:400 and thus diffraction angles of up to ±12 mrad.

In a preferred embodiment of the invention, it is provided that the frequency of the surface waves or surface acoustic waves (SAW) is continuously varied, which is equivalent to a continuous variation of the grid period, so that all angles of diffraction of a source can be adjusted from 0 mrad, for example, to ±12 mrad.

The wavelength of the acoustical surface wave preferably lies in the range of 1 μm to 50 μm and the amplitude in the range of 1 nm to 100 nm. Diffraction angles of up to ±12 mrad in EUV can be achieved with such values.

For the modification of the incident beam in more than one dimension, for example, in two dimensions, it is advantageous if devices for producing elastic oscillations are provided at several positions on the mirror surface, so that acoustic surface waves can be generated in parallel or not in parallel to the active mirror surface.

If the size of the active mirror surface is insufficient, for example, due to the limited size of piezocrystals, then it is proposed in a further developed form of embodiment to combine the active mirror surfaces of several individual components in order to enlarge the active mirror surface.

In a first embodiment of the invention, it is provided that the device for generating elastic oscillations of the mirror surface comprises a piezoelectric foil. It is preferred that the piezoelectric foil is introduced on the rough side of a sufficiently thin substrate, whereby the other side of the substrate forms the mirror surface for the incident radiation.

The piezoelectric foil can be formed, for example, by a PZT film as is disclosed in VDI-NACHRICHTEN of Dec. 4, 1989, whose disclosure contents will be fully included in the present application. The substrate, onto which the piezoelectric foil is introduced, is a thin Si substrate, for example, a Si wafer. The piezoelectric foil is preferably introduced by means of atomic interconnection techniques, for example, a TiPt connection.

Alternatively to the configuration of the invention with a piezoelectric foil introduced onto a substrate, it is also possible that the total piezoelectric element is comprised of a piezoelectric single crystal.

Point-like or line-form electrodes are used for generating elastic oscillations of the mirror surface on the piezoelectric elements in a first configuration of the invention.

An optical component pursuant to the invention can find use particularly in an exposure device for microlithography with wavelengths of ≦160 nm, particularly in EUV lithography.

Possible components in such an exposure device are, for example, means for broadening the beam of the light source, so-called diffusers, means for variation of the illumination setting as well as means for homogenization of the illumination of the pupil.

In addition to the device, the invention also makes available a process for the illumination of a pregiven range of angles by a light source with a wavelength ≦160 nm, preferably an EUV light source, with an optical device according to the invention. The process first comprises the step that at least one surface wave of predetermined amplitude and frequency is produced on the mirror surface, whereby the frequency is selected such that the incident light from the light source impinges a large number of grid lines generated by the surface wave. Then the frequency of the surface wave is continually varied in a predetermined frequency range, so that a homogeneous illumination is generated in a pregiven range of angles averaged over time, wherein the range of angles lies preferably between −12.0 mrad ≦α≦12.0 mrad.

In a particularly preferred process of production of an optical component according to the invention, one side of a piezoelectric substrate is first superpolished, so that the surface roughness amounts to less than 0.5 nm. Electrodes for inducing acoustic surface waves are applied onto the substrate surface, preferably onto the superpolished surface. In an alternative embodiment, a piezoelectric foil can be applied on the rough side of the substrate, and the foil is combined with the rough side of the substrate by means of atomic techniques, whereby the electrodes for inducing acoustical surface waves are attached to the piezoelectric foil.

In another production process, one side of a substrate is first superpolished, so that the surface roughness amounts to less than 0.5 nm. Then electrodes for inducing acoustical surface waves are applied onto the piezoelectric foil.

BRIEF DESCRIPTION OF THE DRAWINGS

The invention will be described below, for example, on the basis of the figures.

Here:

FIG. 3 shows the intensity over the diffraction angle of an arrangement according to the invention;

FIG. 4 shows a two-dimensional arrangement of interdigital transformers on a surface to be stimulated for generation of a two-dimensional wave field;

DESCRIPTION OF THE INVENTION

Figure 1:
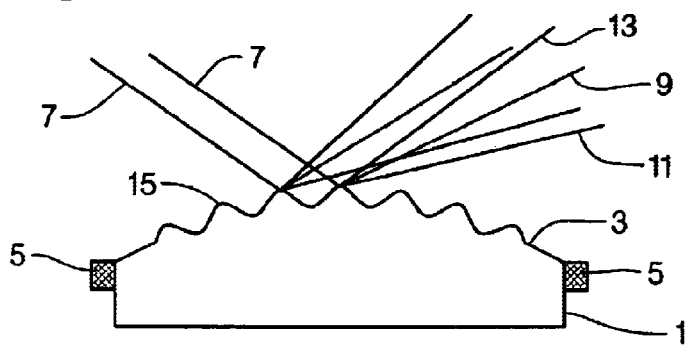
FIG. 1 shows a view of a mirror according to the invention, in principle.

FIG. 1 shows the structure in principle of an optical device according to the invention. In the present case, the optical device comprises a mirror 1 with, for example, a superpolished mirror surface 3 as well as devices 5 for generating oscillations of the mirror surface, for example, interdigital electrodes.

The oscillation frequency by which devices 5 stimulate oscillations of mirror surface 3 is selected such that the radiation 7 impinging on mirror surface 3 is diffracted in a predetermined range. In FIG. 1, the zero diffraction order is 9, the first diffraction order is 11 and the −1 diffraction order is 13 for the incident radiation 7.

Diffraction is characterized by the interference of many rays 7 reflected at a periodic structure, in the present case, surface wave 15. In order to produce a diffraction effect according to the invention, the frequency of surface wave 15 is selected in such a way that the incident light 7 impinges a large number of grid lines, which are built-up by surface wave 15. The number of grid lines, which are impinged by incident light 7, i.e., the maxima of surface wave 15, should amount to more than 100.

Figure 2A:
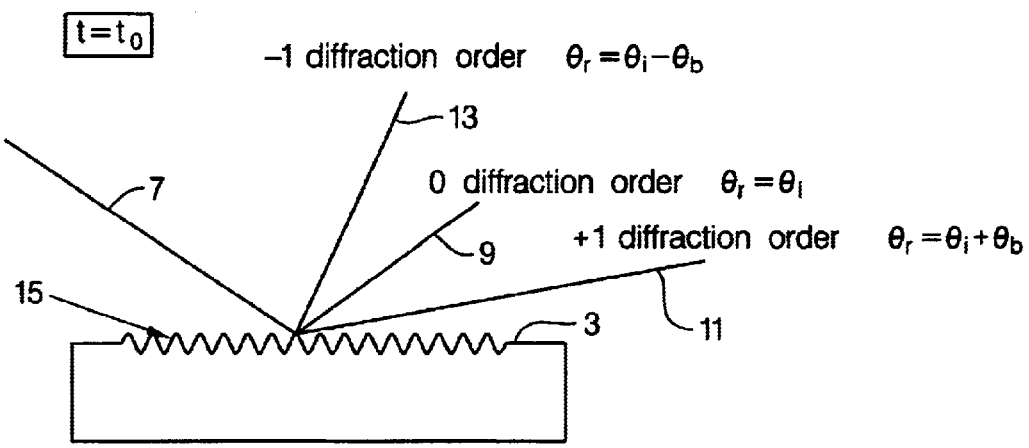
FIGS. 2a–2b show a detailed view of a surface with a surface wave of different wavelengths at different times.
Figure 2B:
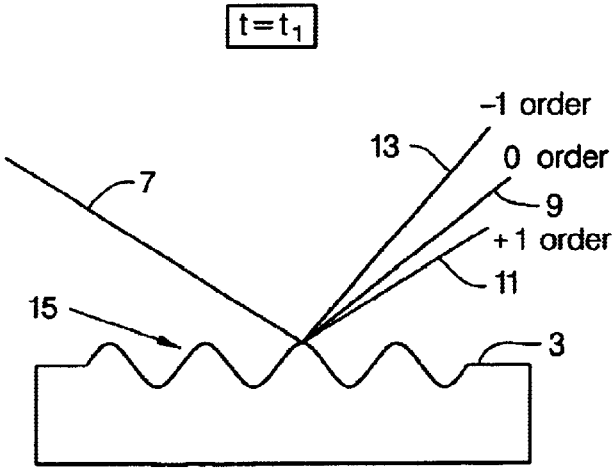

In FIGS. 2a and 2b, the diffraction at a surface structure varied periodically by surface waves is represented in detail once more for different times t=$t_0$ and t=$t_1$.

The same reference numbers were selected in FIGS. 2a and 2b for the same objects as shown in FIG. 1. Reference 7 designates the incident ray on the surface, reference 9, the ray of zero refraction order, in which the angle of reflection is equal to the angle of incidence, i.e., $\theta_r=\theta_i$, reference 11 indicates the first diffraction order, in which the angle of reflection $\theta_r=\theta_i+\theta_b$, whereby $\theta_b$ is the angle of the first diffraction order, as a function of the grid constants of the surface wave and 13 is the ray of the −1 diffraction order at an angle of $\theta_r=\theta_i-\theta_b$.

If the frequency of the surface wave 15 is varied over time, i.e., the wavelength of the surface wave and thus the grid distance produced by the surface wave, the 1 and −1 order will be diffracted into another range of angles. This can be seen from FIG. 2b where the wavelength and thus the grid distance for time t=$t_1$ was increased. The +1 order and −1 orders will be diffracted into a smaller range of angles than in the case of a shorter grid distance, i.e., shorter wavelengths, as is indicated in FIG. 2a for time t=$t_0$.

As FIGS. 2a and 2b indicate, it is thus possible to achieve a homogeneous illumination averaged over time of a range of angles by means of the device according to the invention, by continuous variation of the frequency of the surface wave. The wavelength of the surface waves utilized for the production of the continuous illumination of a range of angles, for example of ±12 mrad, lies in the range of 1 μm to 50 μm, while the amplitude of the surface wave lies in the range of 1 nm to 100 nm. Since in practice, a wave train of the surface wave traverses mirror surface 15 excited by the surface wave, i.e., the active mirror surface, which preferably lies in the range of 10 mm to 100 mm, in approximately 10 μs, approximately 1000 frequencies can be swept through for an exposure time of 1 ms. A variable angle range of the deflection angle of ±12 mrad is then produced.

The intensity distribution that can be achieved by means of the device according to the invention, in which the frequency of the surface wave is continually varied in order to adjust all angles of diffraction of a monochromatic source of 0 mrad to ±12 mrad is shown in FIG. 3. Reference 20 indicates the intensity of the first diffraction order of a grid selected as an example. Reference 22 designates the intensity averaged over time of all diffraction grids which are produced by varying the frequencies. As can be clearly seen, the intensity course plotted over the diffraction angle shows a "hat" profile, i.e., except for small fluctuations, the intensity is essentially constant over the entire range of angles.

In contrast to diffraction, in the case of pure reflection, the relationship: angle of incidence=angle of reflection applies. For the case of reflection, the incident light impinges such that it illuminates less than one wavelength up to a maximum of one wavelength of the grid produced by the surface wave. A constant surface wave in such a case produces only a continuous variation of the angle of reflection. In fact, by this, a predetermined range of angles also can be swept over, but in the case of reflection, the adjustable range of angles is not traversed homogeneously. This in turn has the consequence that a homogeneous illumination cannot be achieved, in contrast to the invention.

An embodiment of the invention is shown in FIG. 4 which permits the modification of a beam impinging on mirror surface 30 in two dimensions. This is achieved by surface waves that are introduced on the active surface 32 in parallel or not in parallel at various locations. For inducing such waves, a total of four excitation devices 34, so-called interdigital transformers, i.e., electrodes, are arranged on the mirror surface in this embodiment.

Figure 5:
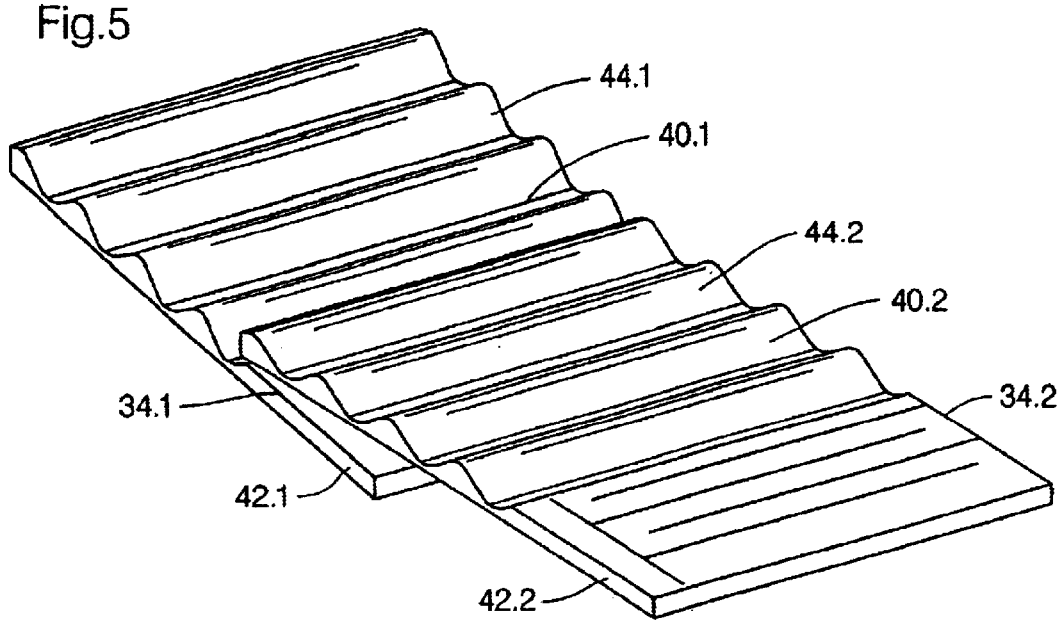
FIG. 5 shows the arrangement of several individual components lying next to one another to form a component for generating a surface wave over a larger range.

In order to increase the active surface of a component, according to the embodiment shown in FIG. 5, the device, presently the mirror surface, can be assembled from various individual components 40.1, 40.2.

Figure 6:
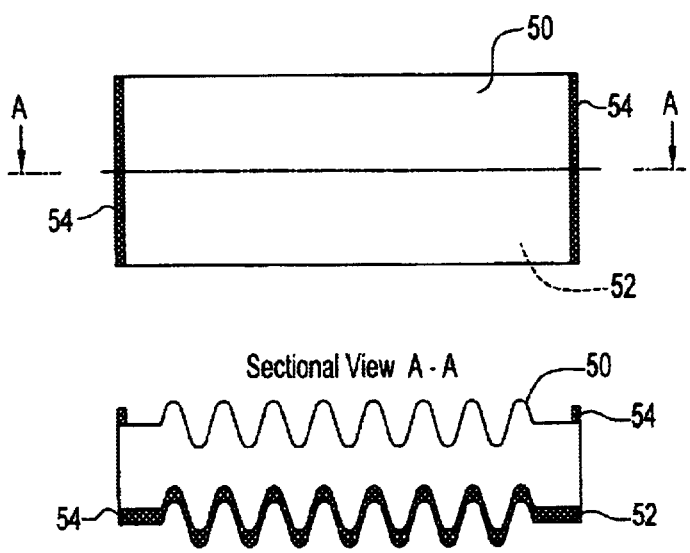
FIG. 6 shows an embodiment of a mirror surface for the generation of surface waves.

The substrate 42.1, 42.2, as well as the excitation devices 34.1, 34.2 arranged on the respective substrate for surface waves 44.1, 44.2 can be clearly seen in FIG. 5. The excitation devices 34.1, 34.2, are formed as interdigital electrodes in the present example. By superimposing the surface waves 44.1, 44.2 stimulated by means of the interdigital electrodes, the active region of a component can be significantly increased. A technical realization of an active component can be embodied, for example, as a silicon wafer, having a mirror surface 50 and a rough side 52, as shown in FIG. 6. A PZT film is applied onto rough side 52, for example, of a silicon wafer disk by means of an atomic connection technique, for example, a TiPt connection. Point-like or line-form electrodes 54 are arranged at defined places. Acoustical surface waves can be produced on very thin wafer disks with these electrodes. A one-dimensional or two-dimensional grid is produced by means of acoustical surface waves, which in turn makes possible the diffraction of an incident light beam according to the invention. In order to be able to produce as large amplitudes as possible, the system can be shifted to self-resonance. The frequencies required for the excitation lie in the 100-10,000-MHz range with powers of 1-200 Watts.

Figure 7:
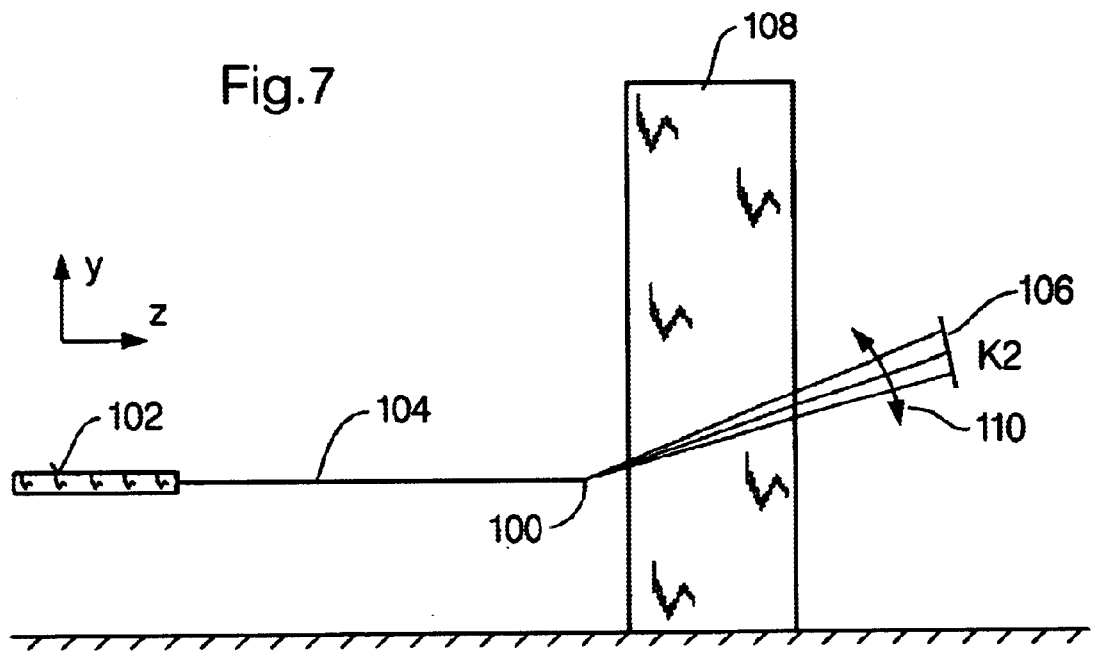
FIG. 7 shows the use of a mirror device according to the invention for beam broadening in the beam path of an illumination system for EUV lithography with undulator light source.
Figure 8:
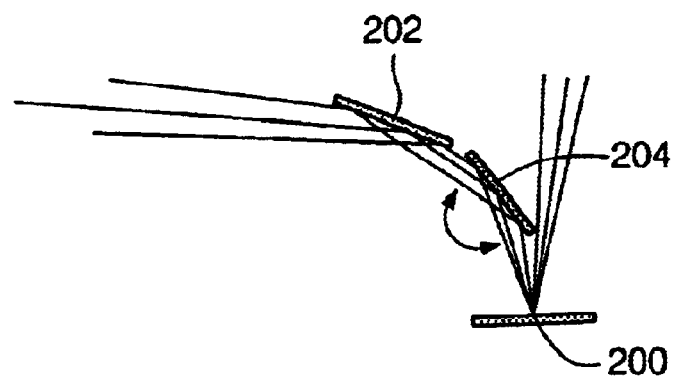
FIG. 8 shows the use of a mirror according to the invention for smearing the intensity peak of the secondary light sources of an EUV exposure system.

FIGS. 7 and 8 show the use of an optical component according to the invention in an illumination system for EUV lithography.

With respect to the principle construction of EUV illumination systems, reference is made to pending applications EP 99 106348.8, filed on Mar. 2, 1999 with the title "Illumination system, particularly for EUV lithography"; U.S. Ser. No. 09/305,017, filed on May 4, 1999 with the title "Illumination system, particularly for EUV lithography"; as well as PCT/EP 99/02999, filed on May 4, 1999, with the title "Illumination system, particularly for EUV lithography"; as well as the application DE 29915847.0, filed on Sep. 3, 1999 with the title "Control of the illumination distribution in the exit pupil of an EUV illumination system".

An illumination system is shown in schematic representation in FIG. 7, in which the collector mirror 100 broadens the beam 104 coming from the synchrotron radiation source 102, for example, an undulater source. The collector mirror is formed as a mirror with a periodically changing surface that produces diffraction effects according to the invention. Collector mirror 106, which lies in the vicinity of the radiation protection wall 108, can be illuminated by such a mirror in the range of angles 110, for example, from −12.0 mrad<α<12.0 mrad.

Part of an illumination system is shown in FIG. 8. This part of the illumination system serves for deflecting the image of the reticle produced by the light source on the wafer surface 200, as well as to form the annular field. Such an arrangement comprises two field mirrors 202, 204 in the example shown in FIG. 8. The second of the two field mirrors 204 is formed as a mirror with a deformable surface according to the invention. Such a mirror serves for avoiding the individual raster elements to be discrete in the intensity distribution of the reticle plane. The mirror 204 effects a smearing of point-like light beams from secondary light sources, which are formed by individual raster elements, averaged over time, and thus provide for a uniform illumination of the annular field.

In the present invention, thus, for the first time, an optical device is shown for uniform illumination of a predetermined range of angles. The optical device is particularly suitable for use in illumination systems for EUV lithography.

What is claimed is:

1. An optical apparatus for radiation having a wavelength ≦160 nm, comprising:
    a mirror with a mirror surface; and
    a device for producing elastic oscillations on said mirror surface,
    wherein said elastic oscillations cause radiation impinging on said mirror surface to be diffracted.

2. The optical apparatus of claim 1, wherein said device generates surface acoustical waves on said mirror surface produce said elastic oscillations.

3. The optical apparatus of claim 2, wherein said surface acoustical waves produce a diffraction grid on said mirror surface.

4. The optical apparatus of claim 2, wherein said surface acoustical waves have a wavelength in the range of about 1 μm to 50 μm.

5. The optical apparatus of claim 2, wherein said surface acoustical waves have an amplitude in the range of about 1 nm to 100 nm.

6. The optical apparatus of claim 2, wherein said surface acoustical waves have a frequency that is varied.

7. The optical apparatus of claim 2,
    wherein said device is a first device and said surface acoustical waves are first surface acoustical waves, and
    wherein said optical apparatus further comprises:
        a second device for generating second acoustical waves on said mirror surface,
    wherein said second surface acoustical waves are parallel to said first surface acoustical waves.

8. The optical apparatus of claim 7, wherein said mirror surface comprises a plurality of individual mirror surfaces.

9. The optical apparatus of claim 2,
wherein said device is a first device and said surface acoustical waves are first surface acoustical waves, and
wherein said optical apparatus further comprises:
a second device for generating second acoustical waves on said mirror surface,
wherein said second surface acoustical waves are not parallel to said first surface acoustical waves.

10. The optical apparatus of claim 9, wherein said mirror surface comprises a plurality of individual mirror surfaces.

11. A method, using the optical apparatus of claim 2, for illuminating a predetermined range of angles ($\alpha$) with said radiation, said method comprising:
generating said surface acoustical waves; and
varying a frequency of said surface acoustical waves,
wherein said surface acoustical waves produce a plurality of grid lines on said mirror surface,
wherein said radiation impinges two or more of said plurality of grid lines, and
wherein said radiation is diffracted in said predetermined range of angles ($\alpha$) and, when averaged over time, homogeneously illuminates said predetermined range of angles ($\alpha$).

12. The method of claim 11, wherein said predetermined range of angles ($\alpha$) is about $-12.0$ mrad $\leq \alpha \leq 12.0$ mrad.

13. The optical apparatus of claim 1, wherein said device comprises a piezoelectric foil.

14. The optical apparatus of claim 13, wherein said piezoelectric foil is a PZT film.

15. The optical apparatus of claim 1, wherein said device comprises a piezoeleetne crystal.

16. The optical apparatus of claim 1, wherein said device comprises a point-like or linear-form electrode.

17. The optical apparatus of claim 1, wherein the optical apparatus is a component in an exposure device for lithography.

18. The optical apparatus of claim 17, wherein said exposure device comprises a source of said radtation, and wherein the optical apparatus broadens a beam of said source.

19. The optical apparatus of claim 17, wherein said exposure device comprises an illumination system, and wherein the optical apparatus varies an illumination setting of said illumination system.

20. The optical apparatus of claim 17, wherein the optical apparatus homogenizes an illumination of a pupil of said exposure device.

21. A method for producing the optical apparatus of claim 1, comprising:
superpolishing a side of a substrate to yield a surface roughness of less than about 0.5 nm; and
attaching an electrode to said substrate,
wherein said mirror surface comprises said side of said substrate, and
wherein said device comprises said electrode.

22. The method of claim 21, wherein said electrode is attached to said superpolished side of said substrate.

23. The optical apparatus of claim 1, wherein said device comprises a piezoelectric foil.

24. The optical apparatus of claim 1, wherein said elastic oscillations generate a plurality of diffraction grids on said mirror surface.

25. The optical apparatus of claim 24, wherein said plurality of diffraction grids are provided by varying a frequency of said elastic oscillations.

26. The optical apparatus of claim 1, wherein said device is a first device, and wherein said optical apparatus further comprises a second device for producing elastic oscillations on said mirror surface.

27. The optical apparatus of claim 26, wherein said first and second devices are arranged on said mirror surface so that a beam of said radiation impinging on said mirror surface is modified in two dimensions.

28. The optical apparatus of claim 1, wherein said device comprises an interdigital transformer.

29. An illumination system for microlithography having a radiation source for emitting radiation having a wavelength $\leq 160$ nm, comprising the optical apparatus of claim 1.

30. A projection exposure apparatus for microlithography, comprising:
the illumination system of claim 29, for illuminating an object; and
a projection objective for imaging said object onto a light sensitive substrate.

31. An optical apparatus for radiation having a wavelength $\leq 160$ nm, comprising:
a mirror with a mirror surface; and
a device for producing elastic oscillations on said mirror surface,
wherein said elastic oscillations cause radiation impinging on said mirror surface to be diffracted in a predetermined range of angles ($\alpha$), and
wherein said predetermined range of angles ($\alpha$) is about $-12$ mrad$=\alpha=$mrad.

* * * * *